United States Patent
Hsu (10) Patent No.: US 8,704,920 B2
(45) Date of Patent: Apr. 22, 2014

(54) COLOR FILTER ARRAY

(75) Inventor: Chung-Jung Hsu, Taipei (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 77 days.

(21) Appl. No.: 13/175,941

(22) Filed: Jul. 4, 2011

(65) Prior Publication Data

US 2011/0261238 A1     Oct. 27, 2011

Related U.S. Application Data

(62) Division of application No. 11/621,079, filed on Jan. 8, 2007, now Pat. No. 8,023,017.

(51) Int. Cl.
| | |
|---|---|
| H04N 3/14 | (2006.01) |
| H04N 9/083 | (2006.01) |
| H04N 5/335 | (2011.01) |
| H04N 9/04 | (2006.01) |

(52) U.S. Cl.
USPC ............................ 348/273; 348/279; 348/280

(58) Field of Classification Search
USPC ................................................ 348/273–280
See application file for complete search history.

(56) References Cited

U.S. PATENT DOCUMENTS

| | | |
|---|---|---|
| 4,710,803 A | 12/1987 | Suzuki |
| 5,119,181 A | 6/1992 | Perregaux |
| 5,703,641 A | 12/1997 | Watanabe |
| 6,379,992 B2 | 4/2002 | Jo |
| 6,395,576 B1 | 5/2002 | Chang |
| 6,522,356 B1* | 2/2003 | Watanabe ..................... 348/272 |
| 6,566,160 B2 | 5/2003 | Yeh |
| 6,590,239 B2 | 7/2003 | Hsiung |
| 6,738,204 B1 | 5/2004 | Chuang |
| 7,576,314 B2* | 8/2009 | Takeuchi ..................... 250/226 |
| 7,630,003 B2 | 12/2009 | Castorina |
| 2003/0122946 A1* | 7/2003 | Nishino et al. ................ 348/297 |
| 2004/0174441 A1 | 9/2004 | Castorina |
| 2005/0018110 A1 | 1/2005 | Liu |
| 2006/0076591 A1 | 4/2006 | Sekine |
| 2006/0119726 A1 | 6/2006 | Oda |
| 2008/0117319 A1 | 5/2008 | Jiang |
| 2010/0309349 A1* | 12/2010 | Kozlowski .................... 348/273 |

FOREIGN PATENT DOCUMENTS

CN         201041590 Y         3/2008

* cited by examiner

*Primary Examiner* — Anthony J Daniels
(74) *Attorney, Agent, or Firm* — Winston Hsu; Scott Margo (57) ABSTRACT

The present invention relates to a color filter array. The color filter array includes a plurality of pixel arrays, which has four color filters arranged in an array. The color of the neighboring color filters is distinct to each other. Moreover, the pattern of the color filter array has enlarged color filters or extended edges in corners of the pattern. These enlarged color filters or extended edges increase the contact area between the pattern and a substrate that the pattern formed on. Therefore, the adhesion strength between the pattern and the substrate can be augmented to prevent peeling from the substrate. According to the invention, the yield of the product will be raised substantially.

20 Claims, 9 Drawing Sheets

COLOR FILTER ARRAY

CROSS REFERENCE TO RELATED APPLICATIONS

This application is a division of application Ser. No. 11/621,079 filed on Jan. 8, 2007 now U.S. Pat. No. 8,023,017.

BACKGROUND OF THE INVENTION

1. Field of the Invention

The invention is related to a color filter array, and particularly, to a color filter array having enlarged color filters or extended edges at corners thereof that is capable of preventing color filter from peeling.

2. Description of the Prior Art

Image sensor includes CMOS image sensors (CIS) and charged-coupled devices (CCD). CMOS image sensors use the materials and technology of semiconductor processes to create photosensitive devices that capture and process an optical image within a single integrated chip. CMOS image sensors are utilized in many industrial and consumer sectors, such as cell phones, personal digital assistants, and industrial digital cameras, etc.

A CMOS image sensor includes a substrate, a plurality of photodiodes, metal interconnects, color filter array and a plurality of microlenses to construct pixels for sensing images. Lights strike the CMOS image sensor through the topmost microlens and are separated by color filters according to their wavelength. The separated lights strike the photodiodes and induce electronic signals. These signals are recorded and processed by other components of the CMOS image sensor. Pixels of the CMOS image sensor are arranged in a pixel array. The pixel array includes an active sensor region composed of an active pixel array, and a dummy pixel array surrounding the active sensor region. The dummy pixel array protects the active pixel array in the active sensor region. In addition, signals generated by the dummy pixel array are used as references of the signals generated by the active pixel array to calibrate noises resulted from CMOS image sensor.

Figure 1:
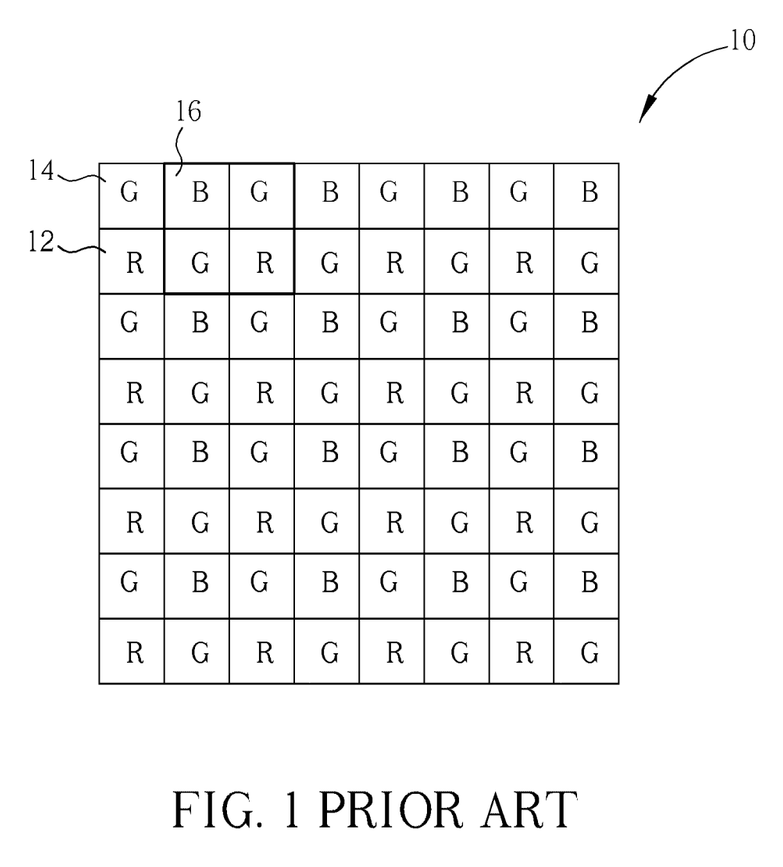
FIG. 1 is a schematic diagram illustrating a color filter array 10 of a conventional CMOS image sensor.

Please refer to FIG. 1. FIG. 1 is a schematic diagram illustrating a color filter array 10 of a conventional CMOS image sensor. The color filter array 10 includes an active pixel area in an active sensor region and a dummy pixel array surrounding the active sensor area. The color filter array 10 has a plurality of red color filters (R) 12, a plurality of green color filters (G) 14, and a plurality of blue color filters (B) 16. Four color filters (G, R, G, B) is a pixel unit, and therefore, the mosaic color filter array is formed by a plurality of pixel units. These color filters separate lights according to their wavelength so that the CMOS image sensor may sense colorful images.

Figure 2:
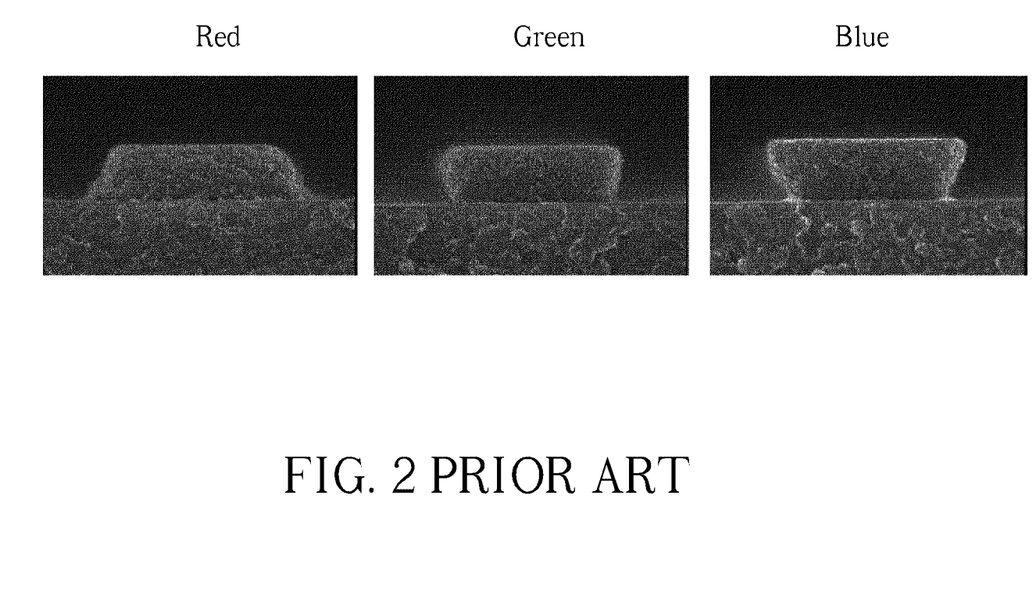
FIG. 2 illustrates a cross-sectional view of a red color filter, a green color filter, and a blue color filter made of negative photoresist.
Figure 3:
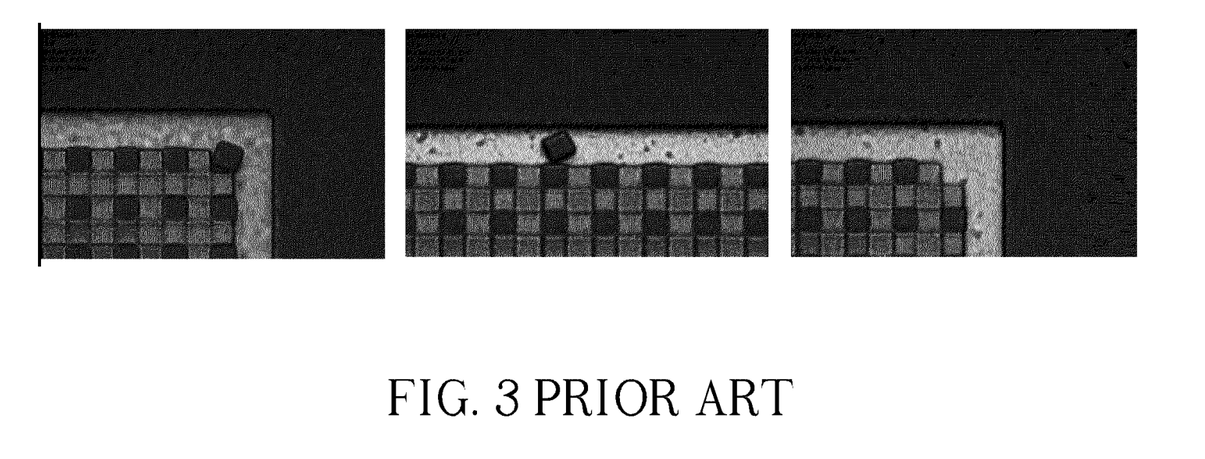
FIG. 3 is a schematic diagram illustrating a part of the dummy pixel array surrounding the active sensor region.

The color filter array uses color photoresist as material, and is formed by several processes in sequence to form the color filters, such as coating, exposing, developing, and baking. Each kind of color filters is formed on the substrate individually, and then, these color filters are pieced up to form the color filter array. Referring to FIG. 2, a cross-sectional view of a red color filter, a green color filter, and a blue color filter made of negative photoresist is shown. Since each kind of negative color photoresist has individual photosensitivity, each kind of color filter has varied cross-sectional shapes. The fabricating processes are performed to form posterior color filters. For instance, developing and cleaning often results in peeling of prior formed color filters from the substrate, especially for the blue color filters, which have the smallest bottom area. Please refer to FIG. 3. FIG. 3 is a schematic diagram illustrating a part of the dummy pixel array, which surrounds the active sensor region. The peeling of color filter is found at the edge or corner of the color filter array. Based on our data, 80% of the color filters that get peeled are peeled from corners of the color filter array. The peeling of color filters is a major problem of fabricating and substantially reduces yield of the product.

SUMMARY OF THE INVENTION

Accordingly, the primary object of the present invention is to provide a color filter array, and particularly, to provide a color filter array having enlarged color filters or extended edges at corners thereof, which can reduce the occurrence of peeling of color filters from corners of the color filter array.

According to the invention, a color filter array is provided. The color filter array comprises a plurality of color filters which are arranged in an array, and a plurality of enlarged color filters disposed at corners of the color filter array. Each enlarged color filter has a greater area than that of each color filter that reduces the possibility of color filter peeling.

According to the invention, another color filter array is provided. The color filter array comprises a plurality of color filters arranged in an array, and a plurality of extended edges disposed at corners of the color filter array. In addition, the extended edges are connected to the color filters at corners of the color filter array.

Consequently, the color filter array of the present invention may be utilized as the color filter array of an active pixel array in an active sensor region, the color filter array of a dummy pixel array surrounding the active sensor region, or combinations thereof. The color filter array of the invention prevents peeling of the color filters, and therefore, substantially increases yield of product.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

Figure 4:
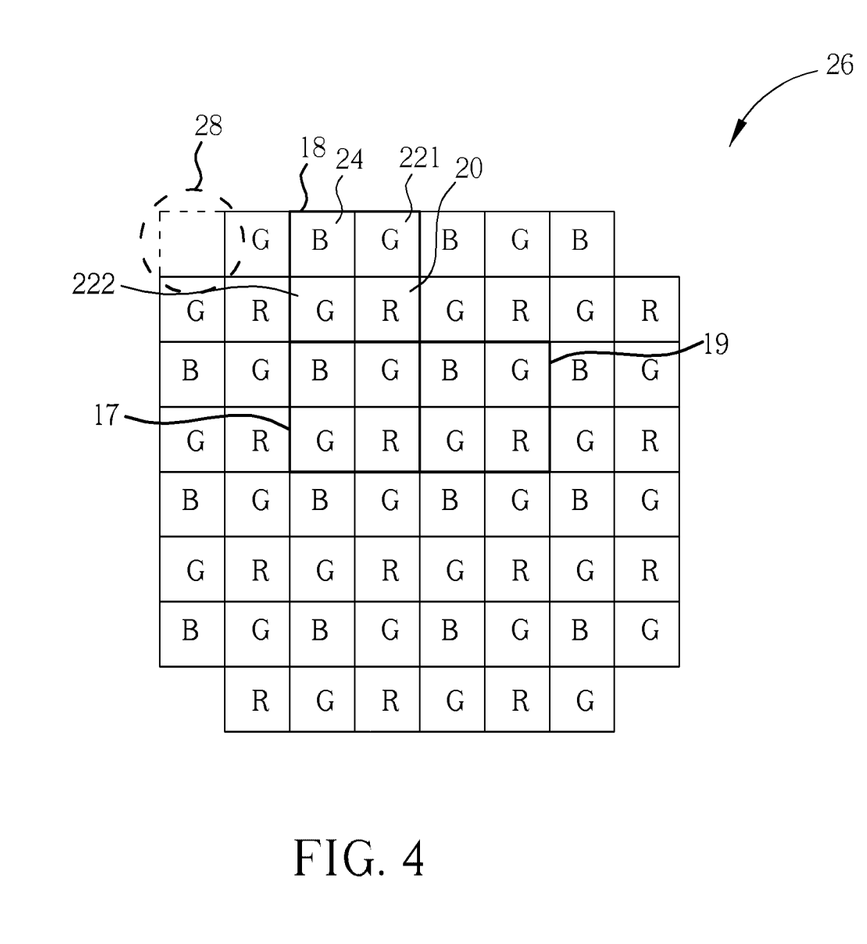
FIG. 4 is a schematic diagram illustrating a color filter array according to the first preferred embodiment of the present invention.

Since 80% of the color filters that get peeled are peeled from corners of the color filter array, a first preferred embodiment of the present invention excludes the color filters, which are supposed to be disposed at corners, to reduce the occurrence of color filter peeling. Please refer to FIG. 4. FIG. 4 is a schematic diagram illustrating a color filter array according to the first preferred embodiment of the present invention. The color filter array is disposed on a surface of a substrate. The substrate includes a plurality of inter-layer dielectric layers, a plurality of metal interconnects, and a plurality of photodiodes. The color filter array comprises a color filter array 26 having notches at corners thereof. The color filter array 26 includes a plurality of cells 17, 18, 19 (shown as a bold frame). Each cell has four color filters and the neighboring color filters have distinct colors. For instance, cell 18 has a blue color filter (B) 24, a first green color filter (G) 221, a second green color filter 222, and a red color filter (R) 20. The blue color filter 24 is disposed on the left side of the first row of the cell where the first green color filter 221 is disposed on the right side. The second green color filter 222 is disposed on the left side of the second row of the cell where the red color filter 20 is disposed on the right side.

The material of color filters of the first preferred embodiment is color photoresist. Each kind of color photoresist has distinct photosensitivity, and results in different cross-sectional shapes of color filters. After several times of performing the color filter fabricating processes, such as coating, exposing, developing, baking and cleaning, the color filters disposed at corners 28 of the color filter array often peel from the substrate. Therefore, the first preferred embodiment of the present invention eliminates the numbers of the color filters disposed at corners 28 to reduce the occurrence of color filter peeling. The color filter 26 array of the first preferred embodiment has no color filter at corners 28 and hence has notches at corners 28 thereof as FIG. 4 shows. In addition, the first preferred embodiment allows more than one color filter at corners to be eliminated, and the eliminated color filter can be any kind of color filters. The color filter array determines the number and the type of the eliminated color filter. At least one color filter disposed at each corner of the color filter array will be eliminated, and the blue color filter having smallest bottom area is preferred.

Figure 5:
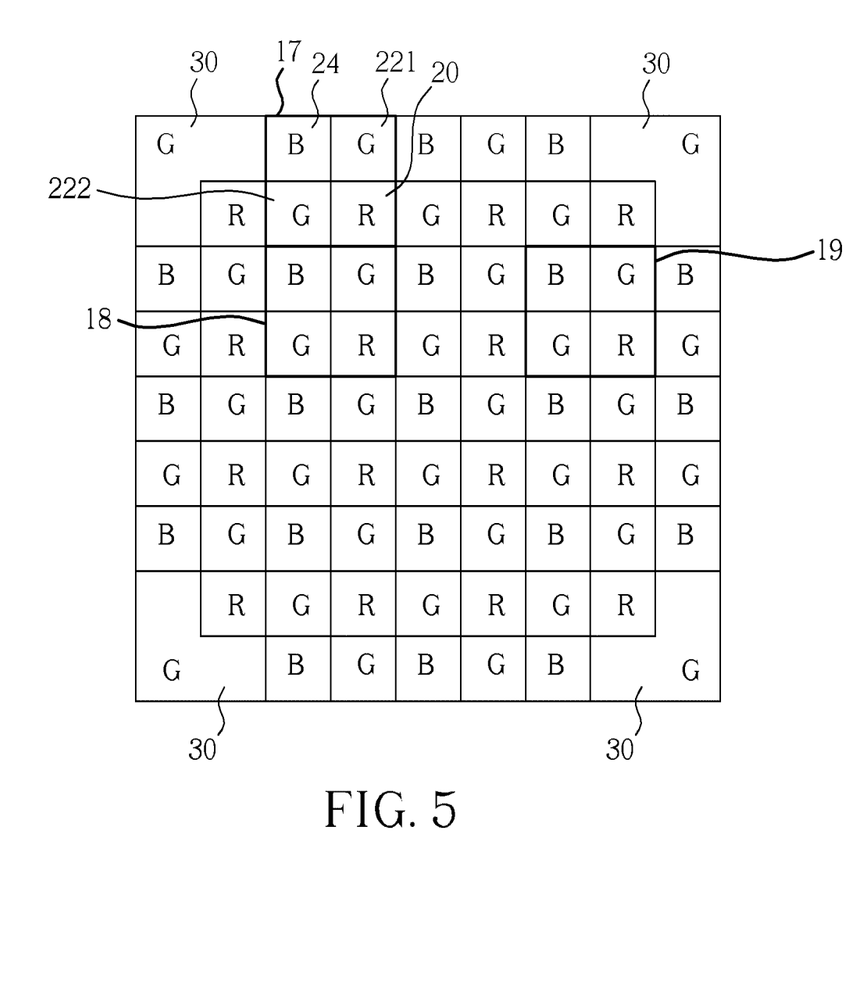
FIG. 5 is a schematic diagram illustrating a color filter array according to the second preferred embodiment of the present invention.

The first preferred embodiment eliminates the number of color filters at corners, and therefore, the color filter array has smoother corners in a macroscopic view. The present invention further provides a second preferred embodiment, which has an intact shape and is capable of preventing color filter peeling. Please refer to FIG. 5. FIG. 5 is a schematic diagram illustrating a color filter array according to the second preferred embodiment of the present invention. Several components are the same as the components of the first preferred embodiment, and these components are remarked as the same number as the first preferred embodiment. The color filter array of the second preferred embodiment is disposed on a substrate (not shown). The substrate includes a plurality of inter-layer dielectric layers, a plurality of metal interconnects, and a plurality of photodiodes. The color filter array 26 includes a plurality of cells 17, 18, 19 (shown as bold frames) and a plurality of enlarged color filters 30 at corners of the color filter array. The neighboring color filters have distinct colors and are arranged as a mosaic array. Each enlarged color filter 30 of the second preferred embodiment replaces at least three color filters of conventional color array at each corner. Each enlarged color filter 30 equals to an area of at least triple of that of one color filter, such as the red color filter 20, the green color filter 221,222, or the blue color filter 24. In virtue of increasing the area of the enlarged color filter 30 at corners, the contact area between the enlarged color filter 30 and the substrate (not shown) is increased. Therefore, the peeling of the enlarged color filters 30 will not occur and the yield of product will be improved.

As the first preferred embodiment illustrated, the second preferred embodiment modifies the patterned mask of the color filters array. Take the enlarged color filters 30 shown in FIG. 5 as example. The patterned mask of the green color filters is modified to expand the opening at corners for a distance of one color filter in vertical and horizontal direction. And therefore, the L-shaped enlarged color filters 30 of the second preferred embodiment are formed. The enlarged color filters 30 may include other shapes, such as a rectangle, a triangle, a parallelogram, a diamond or a color filter having a greater contact area than a conventional color filter. Accordingly, the color filter array of the present invention does not require an additional manufacturing process or a material, and enlarges the contact area of the color filter at corners to reduce the number of peeled color filters and to improve yield of product.

The present invention further provides a third preferred embodiment, which has structures capable of enhancing adhesion at corners of the color filter array to prevent peeling of the color filter arranged surrounding the color filter array. Please refer to FIG. 6, which illustrates a color filter array according to the third preferred embodiment of the present invention. Several components are the same as the components of the first preferred embodiment, and these components are remarked as the same number as the first preferred embodiment. The color filter array of the third preferred embodiment is disposed on a substrate (not shown). The substrate includes a plurality of inter-layer dielectric layers, a plurality of metal interconnects, and a plurality of photodiodes. The color filter array of the third preferred embodiment is arranged as a mosaic array, and includes a plurality of cells 17, 18, 19 (shown as bold frames) and a plurality of extended edges 32 at corners of the color filter array. Each cell has four color filters and the neighboring color filters have distinct colors. For instance, cell 18 has a blue color filter 24, a first green color filter 221, a second green color filter 222, and a red color filter 20. The blue color filter 24 is disposed on the left side of the first row of the cell 18 where the first green color filter 221 is disposed on the right side as the first preferred embodiment. The second green color filter 222 is disposed on the left side of the second row of the cell where the red color filter 20 is disposed on the right side.

Figure 6:
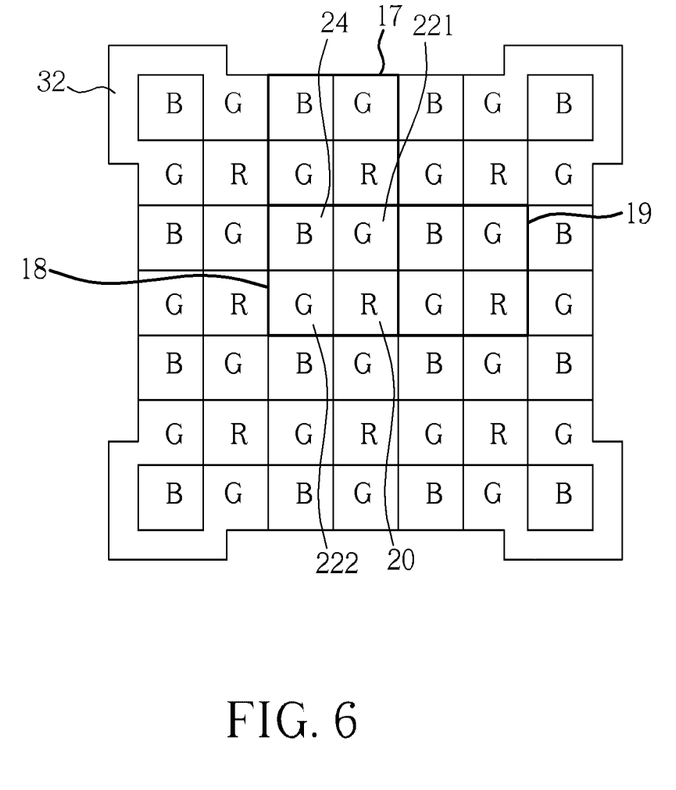
FIG. 6 illustrates a color filter array according to the third preferred embodiment of the present invention.

The third preferred embodiment of the present invention has extended edges 32 at corners of the color filter array. Each extended edges 32 connects to the neighboring color filters and forms an O-shaped structure. The blue color filter 24 is disposed inside the O-shaped structure. In addition, the material of the extended edges 32 uses green photoresist as the green color filter 221, 222. A mask having an O-shaped opening at corners of the color filter array is utilized to form the O-shaped structure formed by connecting the extended edges 32 and the green color filter at the corner. The third preferred embodiment achieves the objective of enlarging contact area between the color filters at corners and the substrate to reduce peeling of the color filters. In addition, the third preferred embodiment may use other materials to form the extended edges, such as blue photoresist, red color photoresist, or any material of color filters. The color and the size of the extended edges may be modified according to requirements.

Figure 7:
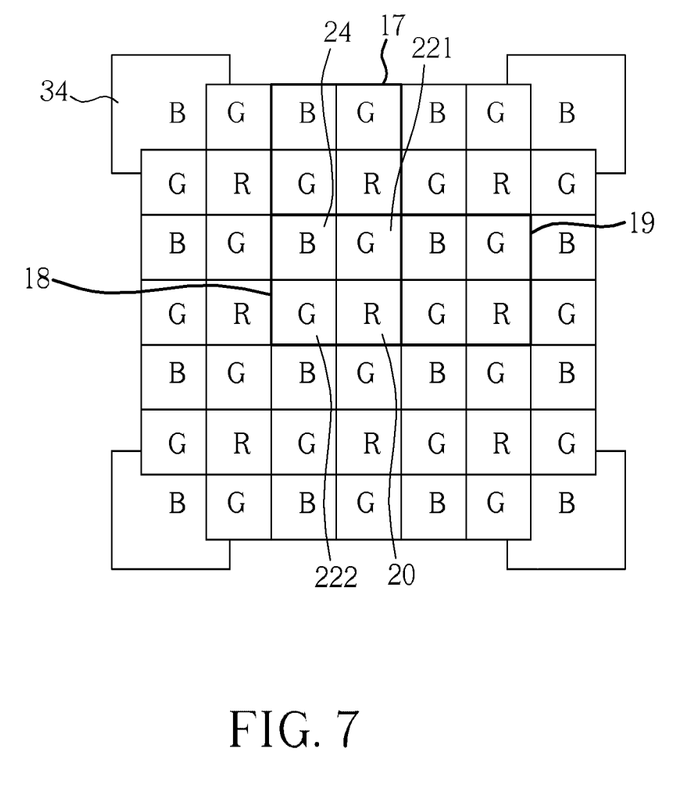
FIG. 7 is a schematic diagrams illustrating a color filter array according to a fourth preferred embodiment of the present invention.

In the third preferred embodiment, the extended edges connect to the neighboring color filters to form the O-shaped structure. Additionally, each extended edge and the color filter next to the extended edge may be combined as one extended color filter having greater area than that of the other color filters. As shown in FIG. 7, FIG. 7 is a schematic diagrams illustrating a color filter array according to a fourth preferred embodiment of the present invention. Several components are the same as the components of the first preferred embodiment, and these components are remarked as the same number as the first preferred embodiment. The color filter array of the third preferred embodiment is disposed on a substrate (not shown). The substrate includes a plurality of inter-layer dielectric layers, a plurality of metal interconnects, and a plurality of photodiodes. The color filter array of the fourth preferred embodiment is arranged as a mosaic array, and includes a plurality of cells 17, 18, 19 (shown as bold frames) and a plurality of extended color filters 34 at corners of the color filter array. Each cell has four color filters and the neighboring color filters have distinct colors. For instance, cell 18 has a blue color filter 24, a first green color filter 221, a second green color filter 222, and a red color filter 20. The blue color filter 24 is disposed on the left side of the first row of the cell 18 where the first green color filter 221 is disposed on the right side as the first preferred embodiment. The second green color filter 222 is disposed on the left side of the second row of the cell where the red color filter 20 is disposed on the right side.

The characteristic of the fourth preferred embodiment is to combine the extended edges of the third preferred embodiment and the color filters at corners by using the same color photoresist. And therefore, the extended color filters 34 are formed. The color filters 34 have the same area as that of the extended edges and the color filters at corners. The extended color filters 34 have greater area than other color filters, and are not easily peeled from the substrate (not shown).

Figure 8:
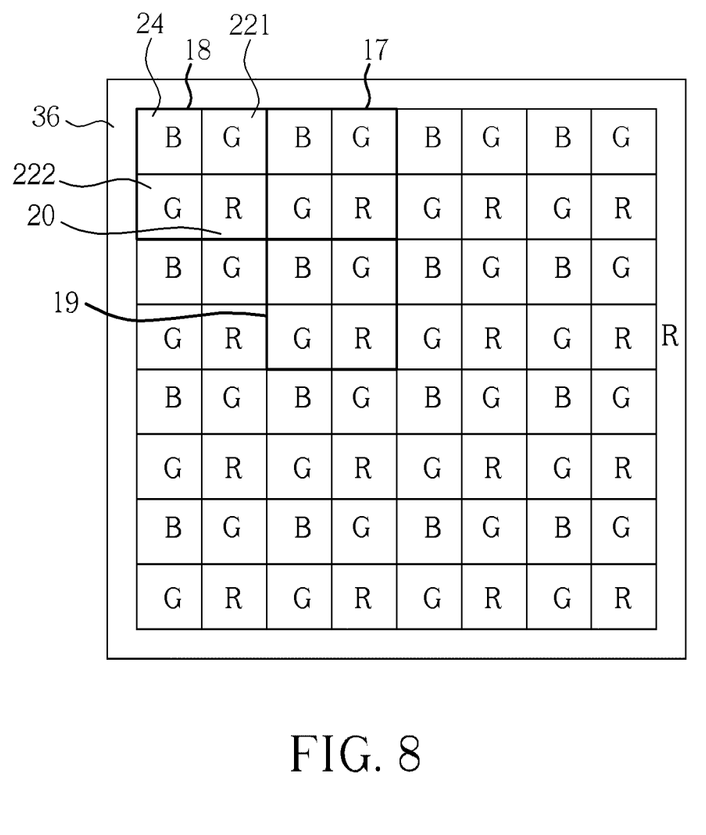
FIG. 8 is a schematic diagram illustrating a color filter array having a border surrounding the color filter according to the fifth preferred embodiment of the present invention.

Furthermore, the present invention provides a fifth preferred embodiment. Referring to FIG. 8, FIG. 8 is a schematic diagram illustrating a color filter array having a border surrounding the color filter according to the fifth preferred embodiment of the present invention. Several components are the same as the components of the first preferred embodiment, and these components are remarked as the same number as the first preferred embodiment. The color filter array of the third preferred embodiment is disposed on a substrate (not shown). The substrate includes a plurality of inter-layer dielectric layers, a plurality of metal interconnects, and a plurality of photodiodes. The color filter array of the fifth preferred embodiment is arranged as a mosaic array, and includes a plurality of cells 17, 18, 19 (shown as bold frames) and a border 36. Each cell has four color filters and the neighboring color filters have distinct colors. For instance, cell 18 has a blue color filter 24, a first green color filter 221, a second green color filter 222, and a red color filter 20. The blue color filter 24 is disposed on the left side of the first row of the cell 18 where the first green color filter 221 is disposed on the right side as the first preferred embodiment. The second green color filter 222 is disposed on the left side of the second row of the cell where the red color filter 20 is disposed on the right side.

The border 36 of the fifth preferred embodiment is formed by elongating the extended edges of the third preferred embodiment vertically and horizontally and connecting the elongating extended edges. And therefore, the border 36 is formed and surrounds the color filter array to prevent the red color filters 20, the green color filters 221,222, or the blue color filters 24 disposed at edges or at corners of the color filter array peeling from the surface of the substrate (not shown).

Figure 9:
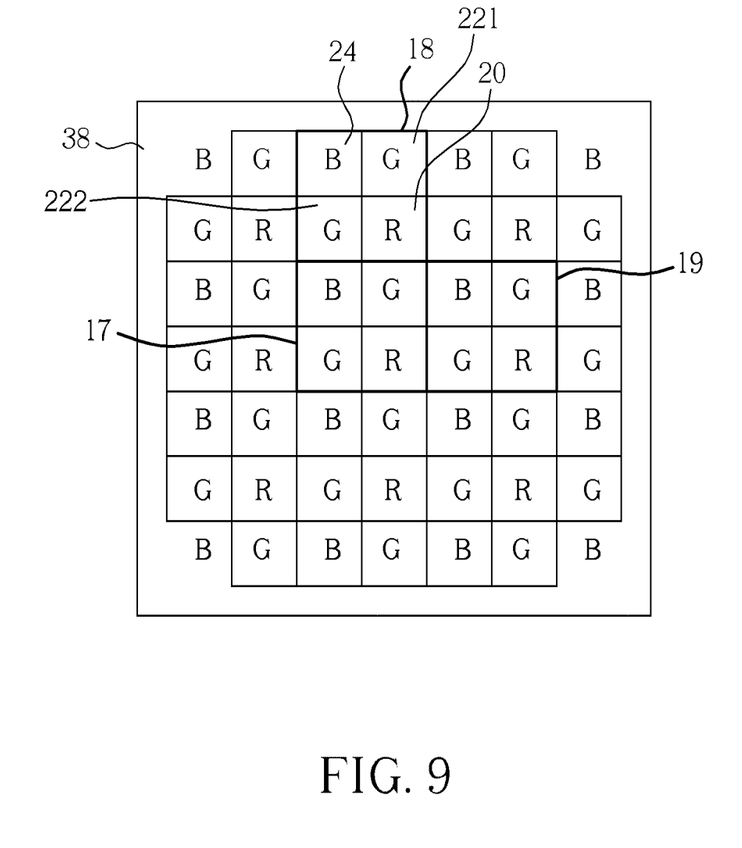
FIG. 9 is a schematic diagram illustrating a color filter array according to the sixth preferred embodiment of the present invention.

The border 36 shown in FIG. 8 is made of red photoresist as the same material of the red color filters 20. The border 36 may use materials of green color filters 221,222, or blue color filters 24. In addition, the border 36 may also connect to the color filter disposed at the outer ring of the color filter array to form a sixth preferred embodiment of the present invention. As shown in FIG. 9, FIG. 9 is a schematic diagram illustrating a color filter array according to the sixth preferred embodiment of the present invention. Several components are the same as the components of the first preferred embodiment, and these components are remarked as the same number as the first preferred embodiment. The color filter array of the third preferred embodiment is disposed on a substrate (not shown). The substrate includes a plurality of inter-layer dielectric layers, a plurality of metal interconnects, and a plurality of photodiodes. The color filter array of the sixth preferred embodiment is arranged as a mosaic array, and includes a plurality of cells 17, 18, 19 (shown as bold frames) and a border 38. Each cell has four color filters and the neighboring color filters have distinct colors. For instance, cell 18 has a blue color filter 24, a first green color filter 221, a second green color filter 222, and a red color filter 20. The blue color filter 24 is disposed on the left side of the first row of the cell 18 where the first green color filter 221 is disposed on the right side as the first preferred embodiment. The second green color filter 222 is disposed on the left side of the second row of the cell where the red color filter 20 is disposed on the right side.

It is worth noting that the border 38 of the sixth preferred embodiment combines the blue color filters 24 at the other ring of the color filter array, and the contact area between the border 38 and the substrate (not shown) is increased. The border 38 connects to more color filters than aforementioned embodiments and is capable of protecting the color filters at edges or at corners. Accordingly, the occurrence of color filter peeling is reduced.

The preferred embodiments use a RGB color filter array comprising red, green and blue color filters for illustration, and other patterns for color filter array are allowed. For instance, a CMY color filter array comprising cyan, magenta, and yellow color (Y) filters, a RGBE color filter array comprising red, green, blue, and emerald color filters, a CMGY color filter array comprising cyan, magenta, yellow, and green pattern, or a YGCW color filter array comprising yellow, green, cyan, and unfiltered color filters is allowed. The enlarged color filters, the extended edges, and the borders may be formed by materials other than color photoresist, such as resin with color dyes, color glasses, or dichroic films. The manufacturing process of the color filter array of the present invention may be modified according to the material of the color filter array. Moreover, the shape of the color filters of the present invention may include triangle, parallelogram, or diamond. The color filter array arrangement may be changed depending on requirements. The color filter array arrangement may be a delta array arrangement, a parallelogram array arrangement or other kinds of array arrangement suitable for the present invention.

According to above-mentioned embodiments, the color filter array of the present invention has enlarged color filters or extended edges at corners of the color filter array, or a border surrounding the color filter array. The color filter array of the present invention may also comprise a color filter array having enlarged color filters, extended edges at corners of the color filter array, and the border surrounding the color filter array. The extended edges or the border may also connect to the neighboring enlarged color filters or the color filters at corners to enlarge a contact area between the color filters and the substrate and to prevent peeling of color filters. Therefore, the color filter array of the present invention is suitable for the active pixel array in the active sensor region, the dummy pixel array surrounding the active sensor region, or both pixel arrays thereof. The color array may be used in a CIS; an image sensing device, such as CCD; a image display device, such as a LCD panel, a digital light processing device (DLP), a liquid crystal on silicon (LCoS) display; or other devices having color filters thereon. Therefore, the yield of the product is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A color filter array, comprising:
a plurality of color filters arranged in an array and a plurality of extended edges disposed at corners of the color filter array;
wherein each of the extended edges is respectively extended from two adjacent outer sides of each of the color filters respectively disposed at corners of the color filter array and is respectively connected to each of the color filters respectively disposed at the corners of the color filter array.

2. The color filter array according to claim 1, wherein each of the extended edges and the corresponding color filter connected thereto have identical color.

3. The color filter array according to claim 2, wherein any two of the extended edges are not connected.

4. The color filter array according to claim 3, wherein the color filters disposed at the corners of the color filter array have identical color.

5. The color filter array according to claim 2, wherein the color filters disposed at the corners of the color filter array have identical color.

6. The color filter array according to claim 1, wherein each of the extended edges and each of the color filters connected thereto have distinct colors.

7. The color filter array according to claim 6, wherein each of the extended edges and two of the color filters next to each of the color filters at the corners of the color filter array form an O-shaped structure.

8. The color filter array according to claim 7, wherein the color filters disposed at the corners of the color filter array have identical color.

9. The color filter array according to claim 1, wherein the extended edges are connected as a piece of a single border of the color filter array and the single border of the color filter array is framed around the array.

10. The color filter array according to claim 9, wherein each of the extended edges and the corresponding color filter connected thereto have identical color.

11. The color filter array according to claim 10, wherein the color filters disposed at the corners of the color filter array have identical color.

12. The color filter array according to claim 9, wherein each of the extended edges and each of the color filters connected thereto have distinct colors.

13. The color filter array according to claim 12, wherein at least two of the color filters at the corners of the color filter array have distinct colors.

14. The color filter array according to claim 1, wherein the array is rectangular.

15. The color filter array according to claim 14, wherein the extended edges are L-shaped.

16. The color filter array according to claim 15, wherein two outer ends of each of the extended edges are positioned beside two color filters next to each of the color filters at the corners of the color filter array.

17. The color filter array according to claim 14, wherein the extended edges are connected to each other.

18. The color filter array according to claim 17, wherein the color filters disposed at the corners of the color filter array have identical color.

19. The color filter array according to claim 18, wherein the extended edges and the color filters disposed at the corners of the color filter array have identical color.

20. The color filter array according to claim 14, wherein at least two of the color filters at the corners of the color filter array have distinct colors.

* * * * *